US010439280B1

(12) United States Patent
Kawamura et al.

(10) Patent No.: US 10,439,280 B1
(45) Date of Patent: Oct. 8, 2019

(54) ANTENNA MEASUREMENT SYSTEM AND ANTENNA MEASUREMENT METHOD

(71) Applicant: ANRITSU CORPORATION, Kanagawa (JP)

(72) Inventors: Takashi Kawamura, Kanagawa (JP); Aya Yamamoto, Kanagawa (JP); Shigenori Mattori, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 16/215,782

(22) Filed: Dec. 11, 2018

(30) Foreign Application Priority Data

Dec. 21, 2017 (JP) ................... 2017-245462

(51) Int. Cl.
*G01R 29/10* (2006.01)
*H01Q 3/02* (2006.01)
*H01Q 3/00* (2006.01)

(52) U.S. Cl.
CPC ............. *H01Q 3/02* (2013.01); *H01Q 3/00* (2013.01)

(58) Field of Classification Search
CPC ........ G01R 29/10; H01Q 3/24; H01Q 3/2605; H01Q 3/267; H01Q 3/28; H01Q 3/30; H01Q 3/26
USPC .......................... 324/750.12, 144, 437–446, 324/754.01–758.01, 690, 696, 715, 724, 324/149, 751, 752, 95; 455/67.11, 1, 455/41.1, 275, 126

See application file for complete search history.

(56) References Cited

U.S. PATENT DOCUMENTS

| | | | | |
|---|---|---|---|---|
| 8,410,987 B2 * | 4/2013 | Eibert | ................... | G01R 29/10 343/703 |
| 8,423,316 B2 * | 4/2013 | Cho | ................... | G01R 29/10 343/703 |
| 8,587,335 B2 * | 11/2013 | Gregg | ................ | G01R 31/2822 324/511 |
| 8,867,990 B2 * | 10/2014 | Royston | ............... | H04B 5/0031 455/41.1 |
| 2009/0042521 A1 * | 2/2009 | Otaka | ................. | H04B 1/0475 455/126 |
| 2010/0015917 A1 * | 1/2010 | Symons | ............... | H04B 5/0075 455/41.1 |

(Continued)

OTHER PUBLICATIONS

Ohmsha, Ltd., "Antenna Engineering Handbook", The Institute of Electronics, Information and Communication Engineers, (Second Edition), pp. 730 to 733, Published on Jul. 25, 2008.

(Continued)

*Primary Examiner* — Jermele M Hollington
*Assistant Examiner* — Taqi R Nasir

(57) ABSTRACT

A distance between a center of a first probe antenna and a center of a second probe antenna in a measurement plane is longer than a distance between the center of the first probe antenna and a center of a third probe antenna in the measurement plane by a distance between two measurement positions adjacent to each other in a horizontal direction. A distance between a center of a fourth probe antenna and a center of a fifth probe antenna in the measurement plane is longer than a distance between the center of the fourth probe antenna and a center of a sixth probe antenna in the measurement plane by a distance between two measurement positions adjacent to each other in a vertical direction.

20 Claims, 12 Drawing Sheets

(56) References Cited

U.S. PATENT DOCUMENTS

| | | | |
|---|---|---|---|
| 2010/0301934 A1* | 12/2010 | Drogi | H03F 1/0205 |
| | | | 330/127 |
| 2012/0040602 A1* | 2/2012 | Charland | F41H 13/0075 |
| | | | 455/1 |
| 2012/0227484 A1* | 9/2012 | Chen | A61M 1/28 |
| | | | 73/304 R |
| 2013/0057447 A1* | 3/2013 | Pivit | H01Q 3/267 |
| | | | 343/853 |

OTHER PUBLICATIONS

Aya Yamamoto, et al., "Proposal for Near Field Measurement of Active Antenna System Using Adjacent Probes Phase Difference", ICICE Tech, Rep., vol. 116, No. 249, SRW2016-47, pp. 19-24, Oct. 2016.

* cited by examiner

| d [λ] | Received phase [deg] | Absolute value of phase difference in cases where probe antenna A2 is provided and is not provided [deg] |
|---|---|---|
| 0.5 | −108.9 | 8.2 |
| 1.0 | −110.4 | 6.7 |
| 1.5 | −109.8 | 7.3 |
| 2.0 | −109.5 | 7.6 |
| 2.5 | −111.4 | 5.7 |
| 3.0 | −115.3 | 1.8 |
| 3.5 | −119.5 | 2.4 |
| 4.0 | −122.1 | 5.0 |
| 4.5 | −117.7 | 0.6 |
| 5.0 | −112.8 | 4.3 |

FIG. 8A

| d [λ] | Received phase [deg] | Absolute value of phase difference in cases where probe antenna A2 is provided and is not provided [deg] |
|---|---|---|
| 0.8 | −32.5 | 12.5 |
| 1.0 | −47.3 | 2.3 |
| 1.5 | −50.4 | 5.4 |
| 2.0 | −47.6 | 2.6 |
| 2.5 | −46.1 | 1.1 |
| 3.0 | −44.1 | 0.9 |
| 3.5 | −43.3 | 1.7 |
| 4.0 | −42.2 | 2.8 |
| 4.5 | −41.9 | 3.1 |
| 5.0 | −40.6 | 4.4 |

FIG. 8B

ANTENNA MEASUREMENT SYSTEM AND ANTENNA MEASUREMENT METHOD

TECHNICAL FIELD

The present invention relates to an antenna measurement system and an antenna measurement method, and particularly relates to an antenna measurement system and an antenna measurement method for measuring the characteristics of an antenna formed integrally with an RF circuit using a near field measurement.

BACKGROUND ART

Active antennas have an RF circuit of a radio signal formed integrally with each element of an antenna array, and have a feature capable of controlling the radiation direction and beam shape of electromagnetic waves to be output. Particularly, in a case where the active antennas are used in a base station of moving object communication, there is an advantage in that a coverage area can be freely controlled.

As a measurement of the characteristics of an antenna having strong directivity such as an antenna which is used as such an active antenna, a near field measurement (NFM) for calculating far field directivity from the near electromagnetic field of an antenna on the basis of an electromagnetic field theory has been known.

In the near field measurement, since an electromagnetic field is measured in the vicinity of an antenna, there is an advantage in that a loss of electromagnetic waves due to a space is small, and that not only directivity can be measured but also an antenna can be diagnosed from the near field distribution of the antenna.

Generally, as shown in FIG. 12, among regions of an electromagnetic field which is radiated from the aperture plane of an antenna, a region adjacent to an antenna aperture is a reactive near field region (extreme near field) mainly containing electromagnetic field components that do not contribute to radiation, and a region having no change in directivity depending on a distance from the antenna aperture is called a radiation far field region (far field). The directivity of an antenna to be generally represented refers to directivity measured in this radiation far field region.

The far field is specified as a position away by more than a distance R which satisfies the following Expression (1) with respect to a maximum diameter D (aperture dimension) of an antenna. Here, λ is a free space wavelength. In addition, when a gain of a transmitting antenna is set to Gt, a gain of a receiving antenna is set to Gr, and transmission power is set to be Wt, maximum power Wa capable of being received by a receiving antenna in a free space is represented like the following Expression (2).

$$R > 2D^2/\lambda \quad (1)$$

$$Wa = (\lambda/4\pi R)^2 \cdot Gt \cdot Gr \cdot Wt \quad (2)$$

Therefore, in an antenna having a large aperture plane with a high gain, the distance R increases, and attenuation in a space increases. Further, in a millimeter-wave zone, since a free space wavelength λ decreases in size, there is a problem in that the amount of attenuation further increases, and that it is not likely to measure a low-level side lobe.

A radiation near field region (near field) which is a region located between the reactive near field region and the radiation far field region is a region having a change in directivity in accordance with a distance. In the NFM described above, an electromagnetic field is measured in this radiation near field region, and directivity in a far field is obtained by calculation.

Specifically, the vicinity of an antenna to which a predetermined signal is supplied is scanned by a probe antenna, and the distribution of amplitudes and phases for each scanning position is obtained from a signal received by the probe antenna, thereby allowing directivity at infinity to be obtained by data processing from this distribution. Since a measurement in the vicinity of an antenna is performed, the amount of attenuation in a space is small, and thus it is possible to perform a high-accuracy measurement as compared to a far field measurement.

The NFM is divided into a plurality of types depending on a range in which the vicinity of an antenna to be measured is scanned, but is advantageous to an antenna having a high gain, and a plane NFM which is easy of data processing is widely used.

FIG. 13 shows a configuration of a measurement device that obtains the directivity of an antenna 100 to be measured using the plane NFM. The measurement device 10 includes an antenna support 51 that supports the antenna 100 to be measured in a state where its radiation plane is directed in a predetermined direction, a probe antenna 52 for receiving electromagnetic waves which are output from the antenna 100 to be measured, and a probe scanning mechanism 53 that moves the probe antenna 52 in X and Y directions within a neighboring measurement plane facing the radiation plane of the antenna 100 to be measured.

In addition, the measurement device 10 includes a signal generator 54, an amplitude and phase detector 55, a measurement control unit 56, and a display unit 57. The signal generator 54 assigns a measuring signal to the antenna 100 to be measured. The amplitude and phase detector 55 detects information of an amplitude and a phase from a received signal of the probe antenna 52. The measurement control unit 56 controls the probe scanning mechanism 53 so as to receive an output of the amplitude and phase detector 55 while scanning the position of the probe antenna 52 at a predetermined pitch within a measurement plane P, and obtains far field directivity of the antenna 100 to be measured from distribution of amplitudes and phases within the measurement plane P. The display unit 57 displays the obtained directivity of the antenna 100 to be measured. Meanwhile, as the signal generator 54 and the amplitude and phase detector 55, a network analyzer having their functions can be used, and a personal computer can be used as the measurement control unit 56.

Here, in a case of the NFM, the probe antenna 52 scans the neighboring measurement plane P located away by approximately three wavelengths of a measurement signal from the antenna 100 to be measured, and thus the amplitude and phase of its electric field are detected.

The distribution of amplitudes and phases in the measurement plane P has a form of Fourier transformation of a function which is defined from the directivity of the antenna 100 to be measured and the directivity of the probe antenna 52. In the measurement control unit 56, the function is obtained by inverse Fourier transformation, and then arithmetic processing (probe correction) of removing the directivity of the probe antenna 52 is performed, thereby allowing the directivity of the antenna 100 to be measured to be obtained. In the measurement control unit 56, since data processing can be performed by fast Fourier transformation (FFT), it is possible to calculate the far field directivity of the antenna 100 to be measured at a fast rate.

As described above, it is generally known as disclosed in Non-Patent Document 1 that the distribution of amplitudes and phase in the measurement plane P has a form of Fourier transformation of a function which is defined from the directivity of the antenna to be measured and the directivity of the probe antenna, its function is obtained by inverse Fourier transformation, and then arithmetic processing (probe correction) of removing the directivity of the probe antenna is performed, thereby allowing the directivity of the antenna 100 to be measured to be obtained.

The NFM in which the directivity of the antenna is obtained in this manner has the following advantages over a far field measurement (FFM).

Since the NFM is a measurement in a short distance, a measurement can be performed even in a case where an anechoic chamber is not used, and a large-scale device is not required. In addition, since a device becomes compact in a millimeter-wave band, a measurement in a simple anechoic chamber installed in a living room can be performed, and it is possible to drastically shorten a time spent in constructing a measurement system which is a problem in a measurement in an anechoic chamber. Further, since a measurement in a region having a small free-space loss is performed, it is possible to obtain measurement results with good accuracy.

Further, in the NFM, the distribution of amplitudes and phases in the vicinity of an antenna is obtained. Therefore, in a case where the directivity as designed is not obtained, the cause can be diagnosed. This is a great advantage to a phased array antenna such as an active antenna.

However, in measurement devices of the related art that obtains a distribution of near field phases in the NFM, it is necessary to supply an antenna to be measured with a radio signal to radiate electromagnetic waves of the radio signal from the antenna to be measured, and to assign this radio signal, as a reference signal, to an amplitude and phase detector. On the other hand, a large number of active antennas have a problem in that, since an RF circuit and an antenna are formed integrally with each other, a terminal for inputting and outputting a signal to the antenna is not present, and that the reference signal is not able to be supplied from the RF circuit of the active antenna to the amplitude and phase detector.

A method as follows has been already proposed (for example, see Non-Patent Document 2). Probe antennas of which a plurality are two-dimensionally arranged scan the neighboring field of an antenna to be measured, and measure a phase difference between measurement positions adjacent to each other in a measurement plane. Thus, it is possible to measure the phase and the amplitude in the near field without supplying a reference signal from an antenna to be measured.

In the method disclosed in Non-Patent Document 2, a double-ridge waveguide tube having an opened one end is used as the probe antenna, in order to arrange probe antennas at a distance which is equal to or less than $0.5\lambda$ being a measurement distance required for a near field measurement. The double-ridge waveguide tube has an advantage in that electromagnetic waves of an equal frequency range are able to propagate with a cross-sectional shape smaller than the cross-sectional shape of a waveguide of a standard square waveguide tube.

RELATED ART DOCUMENT

Patent Document

[Non-Patent Document 1] Antenna Engineering Handbook (Second Edition), p 730 to p 733, Published on Jul. 25, 2008 of The Institute of Electronics, Information and Communication Engineers, Ohmsha, Ltd.

[Non-Patent Document 2] "Proposal for Near Field Measurement of Active Antenna System Using Adjacent Probes Phase Difference", Aya Yamamoto, Takashi Kawamura, Masaaki Fuse, IEICE Tech. Rep., vol. 116, no. 249, SRW2016-47, pp. 19-24, October 2016.

DISCLOSURE OF THE INVENTION

Problem that the Invention is to Solve

However, the method disclosed in Non-Patent Document 2 has problems in that each probe antenna has asymmetric phase directivity by an influence between the probe antennas, and the measured phase difference is disturbed. To solve the above problems, a method in which a plurality of probe antennas are arranged to be symmetric, and an obtained phase difference is appropriately averaged, and thereby removing asymmetric phase directivity is considered. However, in this method, the asymmetric phase directivity may be insufficiently removed by receiving an influence by a production error of a double-ridge waveguide tube. In particular, removing the phase difference by the asymmetric phase directivity has difficulty at a position spaced from the antenna to be measured. In a case where far field directivity is calculated, there is a problem of the directivity being disturbed, particularly, at a high angle. The probe antenna using the double-ridge waveguide tube also has a problem in that reflection performs largely and a use band is narrow, in comparison to a probe antenna using a square waveguide tube.

The present invention is contrived in order to solve such a problem of the related art. An object of the present invention is to provide an antenna measurement system and an antenna measurement method which are capable of measuring a phase difference of electromagnetic waves of a radio signal transmitted from an antenna to be measured which is formed integrally with an RF circuit, with high accuracy, at measurement positions adjacent to each other in a measurement plane of a near field region of the antenna to be measured.

Means for Solving the Problem

In order to solve the above problem, according to an aspect of the present invention, there is provided an antenna measurement system that measures an amplitude and a phase of a radio signal transmitted from an antenna to be measured, in a near field, the system including: a plurality of probe antennas that receive radio signals at a plurality of measurement positions set in a predetermined measurement plane of a near field region of the antenna to be measured; a probe scanning mechanism that moves each of the probe antennas to the plurality of measurement positions; an amplitude and phase difference measurement unit that measures a phase difference between radio signals received by the plurality of probe antennas and measures an amplitude of each of the radio signals received by the plurality of probe antennas, every time each of the probe antennas is moved to the measurement position by the probe scanning mechanism; an adjacent phase difference calculation unit that calculates a phase difference between the radio signals at two measurement positions adjacent to each other, from the phase difference measured by the amplitude and phase difference measurement unit; and a phase calculation unit that calculates a phase of the radio signal at each of the measurement positions, from the phase difference calculated by the adjacent phase difference calculation unit. The plurality of probe antennas include a first probe antenna, and a second probe antenna and a third probe antenna disposed to interpose the first probe antenna therebetween. A difference between a distance between a center of the first probe antenna and a center of the second probe antenna in the measurement plane, and a distance between the center of the first probe antenna and a center of the third probe antenna in the measurement plane is a distance between the two measurement positions adjacent to each other.

In addition, in the antenna measurement system according to the aspect of the present invention, the antenna to be measured is integrally formed with an RF function. The probe scanning mechanism moves each of the probe antennas to the plurality of measurement positions while maintaining relative positions of the plurality of probe antennas. The first probe antenna, the second probe antenna, and the third probe antenna are disposed in the measurement plane in a horizontal direction. The plurality of probe antennas further include a fourth probe antenna, and a fifth probe antenna and a sixth probe antenna disposed to interpose the fourth probe antenna therebetween in the measurement plane in a vertical direction. A difference between a distance between a center of the fourth probe antenna and a center of the fifth probe antenna in the measurement plane, and a distance between the center of the fourth probe antenna and a center of the sixth probe antenna in the measurement plane is a distance between two measurement positions which are adjacent to each other in the vertical direction.

With such a configuration, in the antenna measurement system according to the aspect of the present invention, it is possible to measure the phase and the amplitude of a radio signal transmitted from an antenna to be measured which is formed integrally with an RF circuit, in a near field, without supplying a reference signal from the antenna to be measured.

With such a configuration, in the antenna measurement system according to the aspect of the present invention, it is possible to suppress an influence between the probe antennas, and thus to measure a phase difference between adjacent measurement positions in a measurement plane of a near field region of an antenna to be measured, with high accuracy.

With such a configuration, in the antenna measurement system according to the aspect of the present invention, it is possible to use a standard square waveguide tube as the probe antenna. Thus, it is possible to realize a wide use band and a high receiving sensitivity, and it is easy to manufacture the antenna measurement system.

In the antenna measurement system according to the aspect of the present invention, any one of the first probe antenna, the second probe antenna, and the third probe antenna may be also used as any one of the fourth probe antenna, the fifth probe antenna, and the sixth probe antenna.

With such a configuration, in the antenna measurement system according to the aspect of the present invention, it is possible to further suppress the influence between the probe antennas, and to reduce a measurement time by a scanning control unit narrowing a scanning range.

In the antenna measurement system according to the aspect of the present invention, in a case where the first probe antenna is moved to one of the plurality of measurement positions at a first time point, and the third probe antenna is moved to the same measurement position at a second time point, the adjacent phase difference calculation unit may calculate the phase difference between radio signals at the measurement position to which the second probe antenna has been moved at the first time point, and at the measurement position to which the first probe antenna has been moved at the second time point, in a manner that the phase difference between the radio signals received by the first probe antenna and the third probe antenna at the second time point is subtracted from the phase difference of the radio signals received by the second probe antenna and the first probe antenna at the first time point.

In the antenna measurement system according to the aspect of the present invention, in a case where the first probe antenna is moved to one of the plurality of measurement positions at a first time point, and the second probe antenna is moved to the same measurement position at a second time point, the adjacent phase difference calculation unit may calculate the phase difference between radio signals at the measurement position to which the third probe antenna has been moved at the first time point and at the measurement position to which the first probe antenna has been moved at the second time point, in a manner that the phase difference between the radio signals received by the first probe antenna and the third probe antenna at the first time point is subtracted from the phase difference between the radio signals received by the second probe antenna and the first probe antenna at the second time point.

In the antenna measurement system according to the aspect of the present invention, in a case where the fourth probe antenna is moved to one of the plurality of measurement positions at a first time point, and the sixth probe antenna is moved to the same measurement position at a second time point, the adjacent phase difference calculation unit may calculate the phase differences between radio signals at the measurement position to which the fifth probe antenna has been moved at the first time point and at the measurement position to which the fourth probe antenna has been moved at the second time point, in a manner that the phase difference between the radio signals received by the fourth probe antenna and the sixth probe antenna at the second time point is subtracted from the phase difference between the radio signals received by the fifth probe antenna and the fourth probe antenna at the first time point.

In the antenna measurement system according to the aspect of the present invention, in a case where the fourth probe antenna is moved to one of the plurality of measurement positions at a first time point, and the fifth probe antenna is moved to the same measurement position at a second time point, the adjacent phase difference calculation unit may calculate the phase differences between radio signals at the measurement position to which the sixth probe antenna has been moved at the first time point and at the measurement position to which the fourth probe antenna has been moved at the second time point, in a manner that the phase difference between the radio signals received by the fourth probe antenna and the sixth probe antenna at the first time point is subtracted from the phase difference between the radio signals received by the fifth probe antenna and the fourth probe antenna at the second time point.

The antenna measurement system according to the aspect of the present invention may further include a far field directivity calculation unit that calculates far field directivity by using information of the amplitude measured by the amplitude and phase difference measurement unit and information of the phase calculated by the phase calculation unit.

With such a configuration, in the antenna measurement system according to the aspect of the present invention, it is possible to measure a radio signal transmitted from an antenna to be measured which is formed integrally with an RF circuit, by using a near field measurement, and to calculate electric field intensity distribution in a far field.

In the antenna measurement system according to the aspect of the present invention, the phase calculation unit may include a phase difference averaging unit that averages a plurality of phase differences calculated by the adjacent phase difference calculation unit at two measurement positions adjacent to each other, and calculate the phase of the radio signal at each of the measurement position from the phase difference averaged by the phase difference averaging unit.

With such a configuration, in the antenna measurement system according to the aspect of the present invention, it is possible to obtain phase distribution with higher accuracy.

In the antenna measurement system according to the aspect of the present invention, aperture shapes of the plurality of probe antennas may be the same as each other.

With such a configuration, in the antenna measurement system according to the aspect of the present invention, receiving sensitivities of the probe antennas can be set to be equal to each other, and thus it is easy to average the amplitude.

In addition, the antenna measurement system according to the aspect of the present invention may further include an antenna support that supports the antenna to be measured. The antenna support may be configured such that a direction in which an electromagnetic wave radiation plane of the antenna to be measured directly faces the measurement plane is set to a reference direction, and that a direction of the electromagnetic wave radiation plane is capable of being changed from the reference direction.

With such a configuration, in the antenna measurement system according to the aspect of the present invention, even in a case where a beam direction when an antenna to be measured is directed toward the reference direction is away from the center of a measurement plane, it is possible to obtain directivity in the measurement plane having a minimum size by rotating the antenna to be measured.

According to another aspect of the present invention, there is provided an antenna measurement method using a plurality of probe antennas that receive radio signals at a plurality of measurement positions set in a predetermined measurement plane of a near field region of an antenna to be measured in order to measure an amplitude and a phase of the radio signal transmitted from the antenna to be measured, in a near field, the method including: a probe scanning step of moving each of the probe antennas to the plurality of measurement positions; an amplitude and phase difference measuring step of measuring a phase difference between radio signals received by the plurality of probe antennas and measuring an amplitude of each of the radio signals received by the plurality of probe antennas, every time each of the probe antennas is moved to the measurement position in the probe scanning step; an adjacent phase difference calculation step of calculating a phase difference between the radio signals at two measurement positions adjacent to each other from the phase difference measured by the amplitude and phase difference measuring step; and a phase calculation step of calculating the phase of the radio signal at each of the measurement positions from the phase difference calculated by the adjacent phase difference calculation step. The plurality of probe antennas include a first probe antenna, and a second probe antenna and a third probe antenna disposed to interpose the first probe antenna therebetween in the measurement plane. A distance between a center of the first probe antenna and a center of the second probe antenna in the measurement plane is longer than a distance between the center of the first probe antenna and a center of the third probe antenna in the measurement plane by a distance between two measurement positions which are adjacent to each other.

With such a configuration, in the antenna measurement method according to the aspect of the present invention, it is possible to measure a phase and an amplitude of a radio signal transmitted from an antenna to be measured which is formed integrally with an RF circuit, in a near field, without supplying a reference signal from the antenna to be measured.

With such a configuration, in the antenna measurement method according to the aspect of the present invention, it is possible to suppress an influence between the probe antennas, and thus to measure a phase difference between measurement positions adjacent in a measurement plane of a near field region of an antenna to be measured, with high accuracy.

With such a configuration, in the antenna measurement method according to the aspect of the present invention, it is possible to use a standard square waveguide tube as the probe antenna. Thus, it is possible to realize a wide use band and a high receiving sensitivity, and it is easy to manufacture the antenna measurement system. [Advantage of the Invention]

The present invention provides an antenna measurement system and an antenna measurement method which are capable of measuring phase differences between electromagnetic waves of a radio signal transmitted from an antenna to be measured which is formed integrally with an RF circuit, at measurement positions adjacent in a measurement plane of a near field region of the antenna to be measured, with high accuracy.

BRIEF DESCRIPTION OF THE DRAWINGS

FIGS. 8A and 8B are tables illustrating simulation results by the simulation model in FIG. 6.

BEST MODE FOR CARRYING OUT THE INVENTION

Hereinafter, embodiments of an antenna measurement system and an antenna measurement method according to the present invention will be described with reference the accompanying drawings.

First Embodiment

Figure 1:
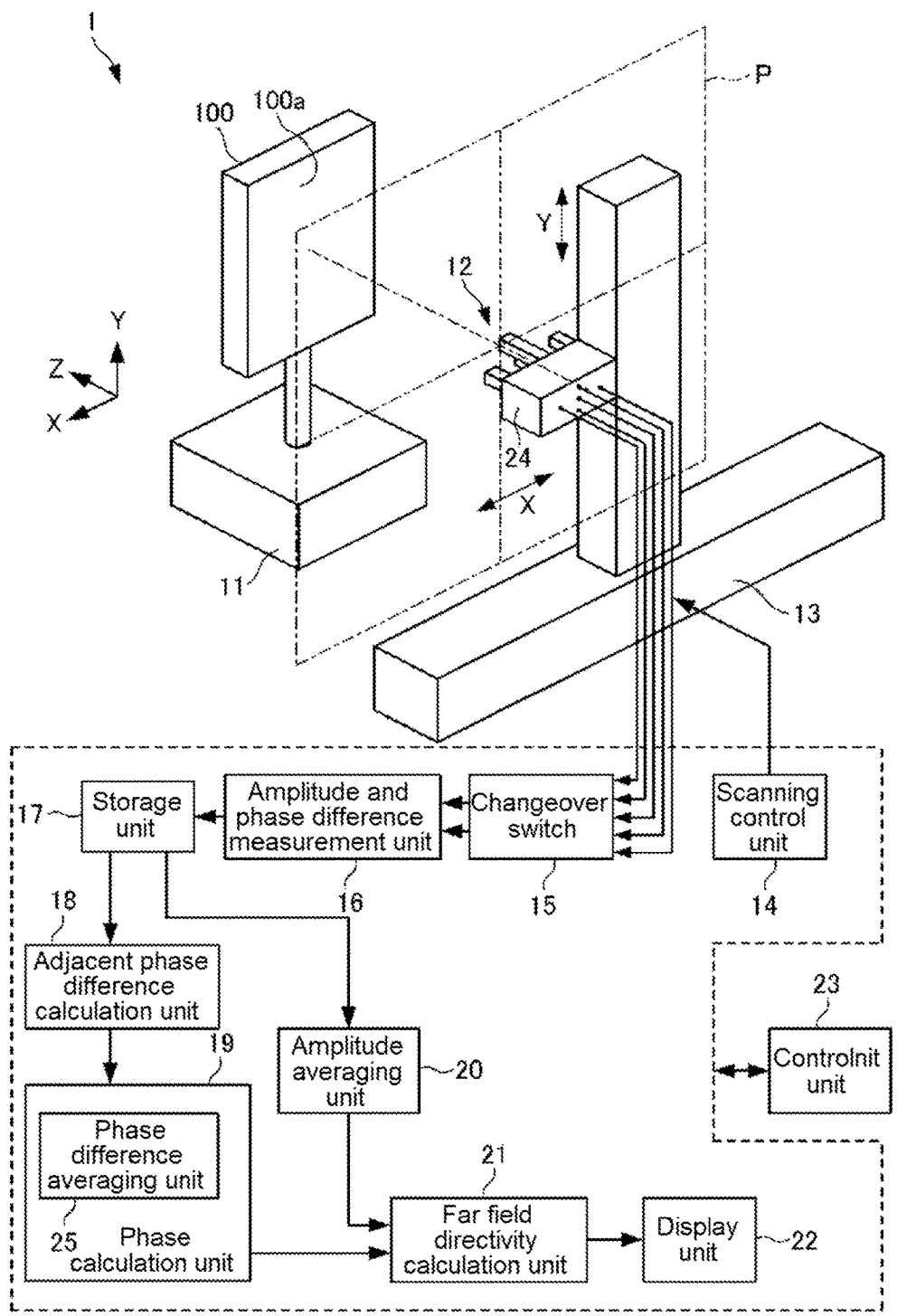
FIG. 1 is a diagram illustrating a configuration of an antenna measurement system according to a first embodiment of the present invention.

As shown in FIG. 1, an antenna measurement system 1 according to a first embodiment of the present invention measures an amplitude and a phase of a radio signal transmitted from an antenna 100 to be measured, in a near field, and calculates directivity in a far field.

The antenna 100 to be measured is, for example, an active antenna formed by integrating an RF function (RF circuit) with a plurality of antenna elements. As a radio signal transmitted from the antenna 100 to be measured during the measurement of the directivity, which is performed by the antenna measurement system 1, a non-modulated wave signal, a broadband signal (for example, OFDM signal), or the like can be used.

The antenna measurement system 1 includes an antenna support 11, a plurality of probe antennas 12, a probe scanning mechanism 13, a scanning control unit 14, a changeover switch 15, an amplitude and phase difference measurement unit 16, a storage unit 17, an adjacent phase difference calculation unit 18, a phase calculation unit 19, an amplitude averaging unit 20, a far field directivity calculation unit 21, a display unit 22, and a control unit 23.

The antenna support 11 is configured to support the antenna 100 to be measured in a state where an electromagnetic wave radiation plane 100a thereof is directed toward a predetermined direction.

The plurality of probe antennas 12 are accommodated in an antenna holding unit 24. Each of the plurality of probe antennas is configured to receive electromagnetic waves of a radio signal output from the antenna 100 to be measured, at a plurality of measurement positions set in a predetermined measurement plane P in a near field region of the antenna 100 to be measured. As will be described later, the plurality of measurement positions are set in a horizontal direction and a vertical direction in the measurement plane P, at a distance which is equal to or less than ½ wavelength (0.5λ) of the radio signal.

The plurality of probe antennas 12 includes a first probe antenna, a second probe antenna, a third probe antenna, a fourth probe antenna, a fifth probe antenna, and a sixth probe antenna. The second probe antenna and the third probe antenna are disposed to interpose the first probe antenna therebetween in the measurement plane P in the horizontal direction (X direction). The fifth probe antenna and the sixth probe antenna are disposed to interpose the fourth probe antenna therebetween in the measurement plane P in a vertical direction (Y direction).

Any one of the first probe antenna, the second probe antenna, and the third probe antenna may also be used as any one of the fourth probe antenna, the fifth probe antenna, and the sixth probe antenna.

All of the plurality of probe antennas 12 may be the same as each other, and may be different from each other. Meanwhile, in a case where all the aperture shapes of the probe antennas 12 are formed to be the same as each other, there are advantages in that the receiving sensitivity of the respective probe antennas become equal to each other, and the amplitude averaging unit 20 which will be described later performs amplitude averaging easily.

For example, at least one of the plurality of probe antennas 12 may be a waveguide tube in which a waveguide for propagating electromagnetic waves in a predetermined frequency range having a micro-wave or millimeter-wave band is provided, and the tip is opened. As such a waveguide tube, a square waveguide tube in which the cross-sectional shape of the waveguide is rectangular can be preferably used. For example, various double-ridge waveguide tubes in which the cross-sectional shape of the waveguide is configured such that the height of a central portion is smaller than the heights of both side portions are capable of being used as the probe antenna 12 instead of the square waveguide tube. However, the double-ridge waveguide tube has a problem in that reflection performs largely and a use band is narrow, in comparison to the square waveguide tube.

Figure 2:
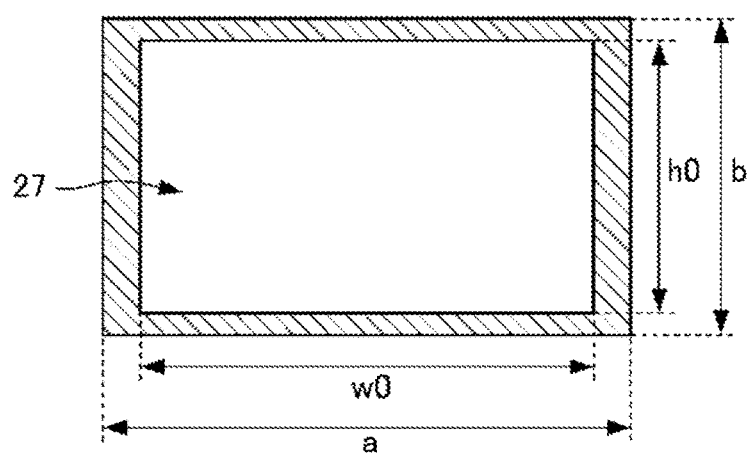
FIG. 2 is a cross-sectional view illustrating a configuration of a probe antenna included in the antenna measurement system according to the first embodiment of the present invention.

FIG. 2 is a diagram illustrating a cross-section perpendicular to a longitudinal direction of a waveguide 27 of a square waveguide tube used as the probe antenna 12. The outward shape a×b of the square waveguide tube is larger than the inside diameter w0×h0 thereof, and is arbitrary in a range in which strength as a structure is obtained.

Figure 3:
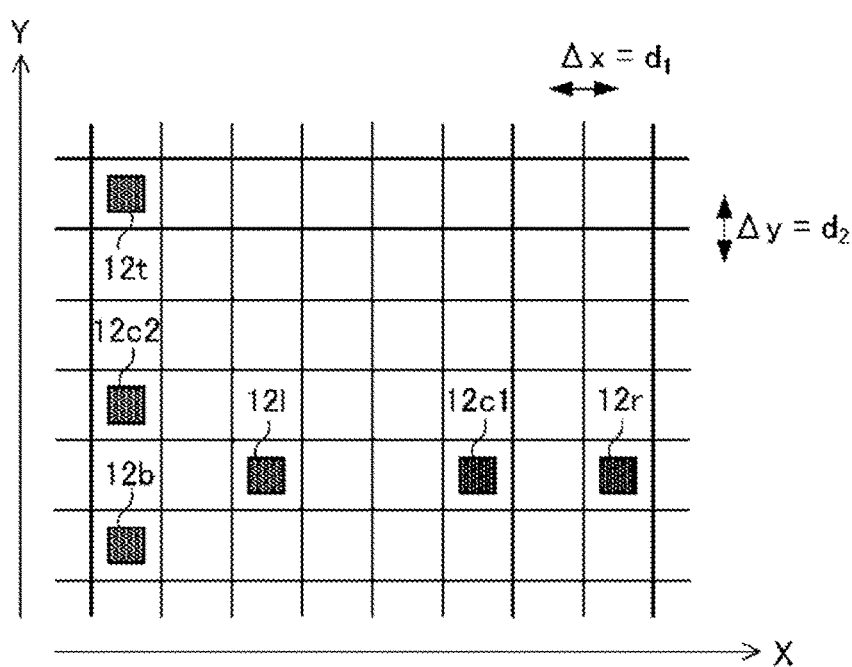
FIG. 3 is a schematic diagram illustrating an arrangement and measurement positions of a plurality of probe antennas included in the antenna measurement system according to the first embodiment of the present invention.

FIG. 3 is a schematic diagram illustrating an example of measurement positions and arranged positions (■ marks in FIG. 3) of the plurality of probe antennas 12, in the measurement plane P. As shown in FIG. 3, the measurement positions can be represented as center positions of regions obtained by dividing the measurement plane P in a lattice shape having Δx of d1 in the X direction and Δy of d2 in the Y direction. Here, the distances d1 and d2 are set to have values which are equal to or less than ½ of a wavelength λ of a radio signal. The distances d1 and d2 may be different from each other or may be equal to each other.

In the example shown in FIG. 3, the plurality of probe antennas 12 includes central probe antennas 12c1 and 12c2, a left probe antenna 12l, a right probe antenna 12r, an upper probe antenna 12t, and a lower probe antenna 12b. Here, the central probe antenna 12c1 corresponds to a first probe antenna. The left probe antenna 12l corresponds to a second probe antenna. The right probe antenna 12r corresponds to a third probe antenna. The central probe antenna 12c2 corresponds to a fourth probe antenna. The upper probe antenna 12t corresponds to a fifth probe antenna. The lower probe antenna 12b corresponds to a sixth probe antenna.

The distance between the center of the first probe antenna and the center of the second probe antenna in the measurement plane P is longer than the distance between the center of the first probe antenna and the center of the third probe antenna in the measurement plane P, by the distance d1 between two measurement positions adjacent to each other in the horizontal direction.

In addition, the distance between the center of the fourth probe antenna and the center of the fifth probe antenna in the measurement plane P is longer than the distance between the center of the fourth probe antenna and the center of the sixth probe antenna in the measurement plane P, by the distance d2 between two measurement positions adjacent to each other in the vertical direction.

Figure 4A:
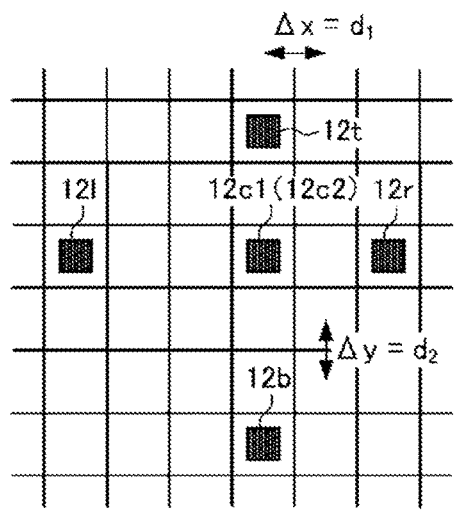
FIGS. 4A to 4C are schematic diagrams illustrating other arrangement examples of the plurality of probe antennas included in the antenna measurement system according to the first embodiment of the present invention.
Figure 4B:
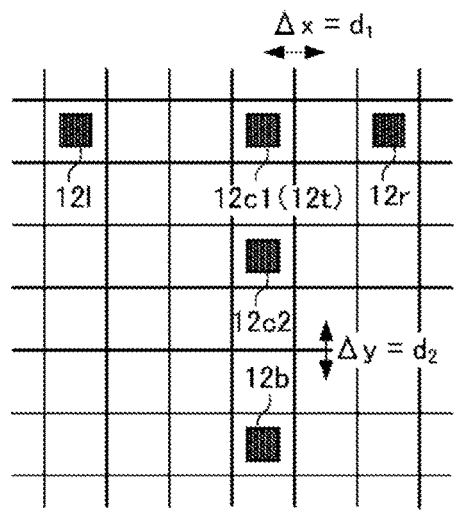
Figure 4C:
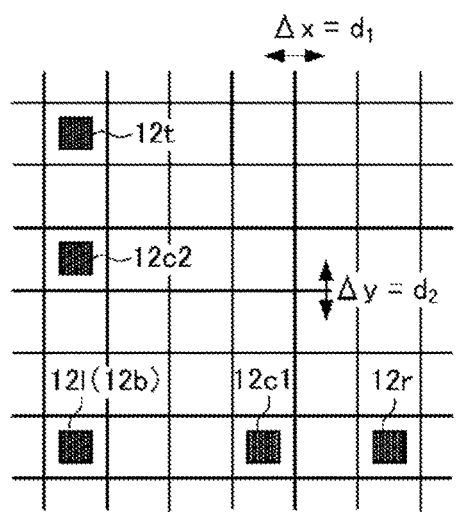

FIGS. 4A to 4C illustrate other arrangement examples of the plurality of probe antennas 12 in the measurement plane P. FIG. 4A illustrates an example of a cross-shaped arrangement. In FIG. 4A, the first probe antenna (central probe antenna 12c1) also functions as the fourth probe antenna (central probe antenna 12c2). FIG. 4B illustrates an example of a T-shaped arrangement. In FIG. 4B, the first probe antenna (central probe antenna 12c1) also functions as the sixth probe antenna (upper probe antenna 12t). FIG. 4C illustrates an example of an L-shaped arrangement. In FIG. 4C, the second probe antenna (left probe antenna 12l) also functions as the fifth probe antenna (lower probe antenna 12b).

The probe scanning mechanism 13 moves the plurality of probe antennas 12 in the X and Y directions in the neighboring measurement plane P facing the electromagnetic wave radiation plane 100a of the antenna 100 to be measured. In this case, the probe scanning mechanism 13 is configured to respectively move the probe antennas 12 at a plurality of measurement positions in the measurement plane P while maintaining relative positions of the plurality of probe antennas 12.

The scanning control unit 14 is configured to perform control for causing the probe scanning mechanism 13 to move the plurality of probe antennas 12 to all the measurement positions in the measurement plane P in a predetermined order. The scanning control unit 14 is configured to send out position information of a measurement position at which each of the probe antennas 12 is present, to the far field directivity calculation unit 21.

The changeover switch 15 is configured to selectively input radio signals received by two probe antennas 12 which are adjacent to each other in the horizontal direction or the vertical direction among the plurality of probe antennas 12, to the amplitude and phase difference measurement unit 16. The changeover switch 15 is configured to be capable of sequentially switching combinations of two probe antennas 12 to be selected. In a case where the number of input ports of a measuring device constituting the amplitude and phase difference measurement unit 16 is equal to or more than the number of the plurality of probe antennas 12, the changeover switch 15 may be omitted.

The amplitude and phase difference measurement unit 16 is configured to measure a phase difference between radio signals (hereinafter, also referred to as "received signals") received in the plurality of probe antennas 12, every time each probe antenna 12 is scanned at the measurement position by the probe scanning mechanism 13.

That is, received signals from the central probe antenna 12c1 and the left probe antenna 12l, received signals from the central probe antenna 12c1 and the right probe antenna 12r, received signals from the central probe antenna 12c2 and the upper probe antenna 12t, and received signals from the central probe antenna 12c2 and the lower probe antenna 12b are input to the amplitude and phase difference measurement unit 16. The received signals may be sequentially switched by using the changeover switch 15, and may be input to the amplitude and phase difference measurement unit 16.

The amplitude and phase difference measurement unit 16 is configured to measure the amplitudes of radio signals received by the plurality of probe antennas 12. The amplitude and phase difference measurement unit 16 may be constituted by a vector network analyzer (VNA), a spectrum analyzer, an oscilloscope, or the like.

The storage unit 17 is configured to store values of phase differences and amplitudes measured by the amplitude and phase difference measurement unit 16, in association with the measurement positions.

The adjacent phase difference calculation unit 18 is configured to calculate a phase difference between radio signals at the adjacent two measurement positions, from the phase difference measured by the amplitude and phase difference measurement unit 16.

The phase calculation unit 19 calculates the phase Ph of a radio signal at each of the measurement positions, from the phase difference calculated by the adjacent phase difference calculation unit 18. Further, the phase calculation unit 19 is configured to output the calculated phase at each of the measurement positions to the far field directivity calculation unit 21, in a form of phase information.

As shown in FIG. 1, the phase calculation unit 19 may include the phase difference averaging unit 25 that averages a plurality of phase differences calculated for the two adjacent measurement positions by the adjacent phase difference calculation unit 18. In this case, the phase calculation unit 19 is configured to calculate the phase of a radio signal at each of the measurement positions from the phase difference averaged by the phase difference averaging unit 25.

The amplitude averaging unit 20 is configured to output the value obtained by averaging a plurality of amplitudes measured at the measurement positions by the amplitude and phase difference measurement unit 16, to the far field directivity calculation unit 21 in a form of amplitude information. The amplitude averaging unit 20 may be omitted. However, in a case where the antenna measurement system 1 includes such an amplitude averaging unit 20, it is possible to calculate the value of an amplitude with higher accuracy.

The far field directivity calculation unit 21 is configured to calculate the far field directivity by using the position information of each of the probe antennas 12, which has been output from the scanning control unit 14, the amplitude information measured by the amplitude and phase difference measurement unit 16 (alternatively, amplitude information obtained by averaging of the amplitude averaging unit 20), and the phase information calculated by the phase calculation unit 19. Here, the electric field intensity distribution in a far field is estimated by performing the numerical calculation of a known near field/far field conversion method, and thus it is possible to obtain directivity of the antenna 100 to be measured in a far field.

The display unit 22 is constituted by a display device such as, for example, an LCD or a CRT, and is configured to display various types of display contents in accordance with a control signal from the control unit 23. The display contents include measurement results of the phase and the amplitude of the antenna 100 to be measured in a near field, calculation results of the directivity of the antenna 100 to be measured in a far field, or the like. Further, the display unit 22 is configured to display an operation target such as soft keys, pull-down menus, and text boxes, which is provided for setting measurement conditions and the like.

The control unit 23 is constituted by, for example, a microcomputer, a personal computer or the like including a CPU, and a ROM, a RAM, a HDD or the like constituting the storage unit 17, and controls an operation of each of the units constituting the antenna measurement system 1.

The adjacent phase difference calculation unit 18, the phase calculation unit 19, the amplitude averaging unit 20, and the far field directivity calculation unit 21 may be constituted by digital circuits such as a field programmable gate array (FPGA) or an application specific integrated circuit (ASIC) or can be constituted in software by the control unit 23 executing a predetermined program. Alternatively, the adjacent phase difference calculation unit 18, the phase calculation unit 19, the amplitude averaging unit 20, and the far field directivity calculation unit 21 may be constituted by appropriately combining a hardware process performed by a digital circuit and a software process performed by a predetermined program.

Therefore, in order to obtain phase distribution in a near field without a reference signal from the antenna 100 to be measured, it is necessary that the plurality of probe antennas are arranged at a distance which is equal to or less than 0.5λ. In order to obtain the directivity of the antenna to be measured up to ±90°, it is necessary that the phase difference is measured at a distance which is equal to or less than the ½ wavelength (0.5λ) of a radio signal in the measurement plane P. However, in the antenna measurement system 1 in the embodiment, as will be described later, the phase difference can be measured in a state where the plurality of probe antennas 12 have been arranged at a distance which is equal to or more than 0.5λ, in the measurement plane P.

Figure 5:
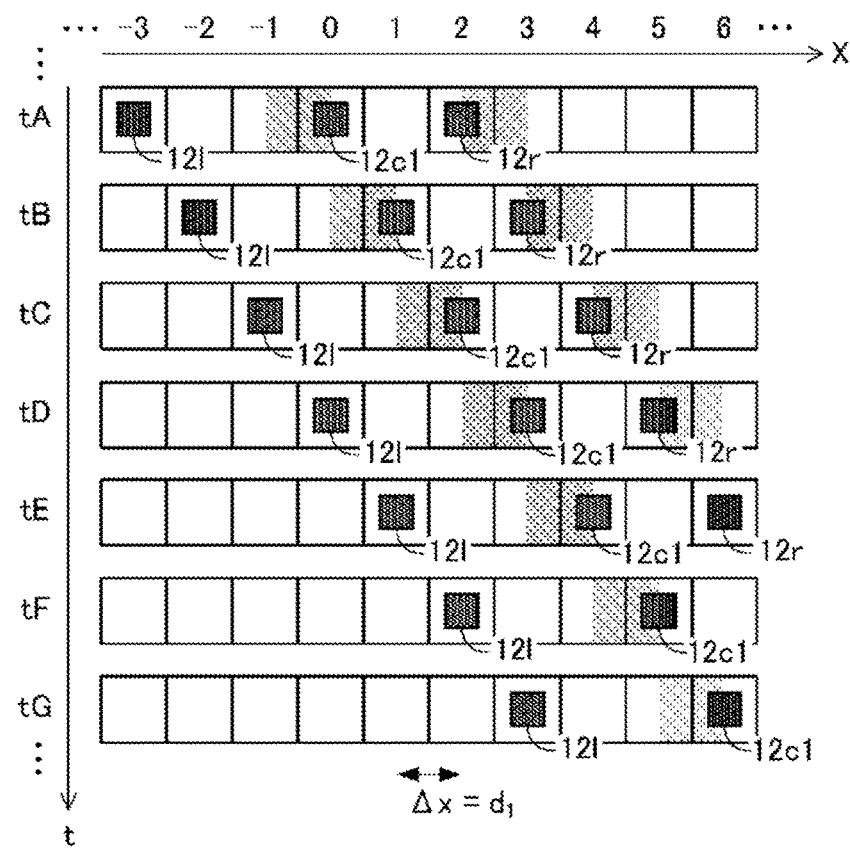
FIG. 5 is a diagram illustrating a process performed by an adjacent phase difference calculation unit of the antenna measurement system according to the first embodiment of the present invention.

FIG. 5 is a diagram illustrating the position of each of the probe antennas in a case where the central probe antenna 12c1, the left probe antenna 12l, and the right probe antenna 12r are moved in the horizontal direction (X direction) of the measurement plane P. A vertical axis indicates a measurement time t.

In FIG. 5, the central probe antenna 12c1 is set as a reference, the left probe antenna 12l is positioned on the left by a distance 3d1, and the right probe antenna 12r is positioned on the right by a distance 2d1. As described above, the distance d1 has a value which is equal to or less than ½ of the wavelength λ of a radio signal. That is, the central probe antenna 12c1 corresponds to the first probe antenna, the left probe antenna 12l corresponds to the second probe antenna, and the right probe antenna 12r corresponds to the third probe antenna. Here, the phase of a radio signal at a position of X=0 is set to "0".

Firstly, the central probe antenna 12c1 is disposed at the position of X=0 in a state where a time point t is tA. The probe antennas move to the right by the distance d1 while maintaining the relative positional relationship between the probe antennas, at the subsequent time points tB, tC, and . . . .

Here, if a state at the time point tA and a state at the time point tC are compared to each other, the right probe antenna 12r and the central probe antenna 12c1 are disposed at the position of X=2. Thus, when the phase difference between the position of X=0 and the position of X=2 at the time point tA is set as ΔPh(0, 2), and the phase difference between the position of X=−1 and the position of X=2 at the time point tC is set as ΔPh(−1, 2), the adjacent phase difference calculation unit 18 calculates the phase difference ΔPh(−1, 0) between the position of X=−1 and the position of X=0, by an expression of ΔPh(−1, 2)−ΔPh(0, 2).

That is, in a case where the first probe antenna moves to one (X=2) of a plurality of measurement positions at a first time point (time point tC), and the third probe antenna moves to the same measurement position at a second time point (time point tA), the adjacent phase difference calculation unit 18 calculates a phase difference between radio signals at the measurement position (X=−1) to which the second probe antenna has moved at the first time point and at the measurement position (X=0) to which the first probe antenna has moved at the second time point, in a manner that the phase difference between radio signals transmitted by the first probe antenna and the third probe antenna at the second time point is subtracted from the phase difference between radio signals received by the second probe antenna and the first probe antenna at the first time point.

Similar to the above descriptions for the positional relationship between the right probe antenna 12r and the central probe antenna 12c1, the adjacent phase difference calculation unit 18 also calculates phase differences ΔPh(0, 1), ΔPh(1, 2), ΔPh(2, 3), . . . at time points subsequent to the time point tB.

If the state at the time point tA and a state at a time point tD are compared, the central probe antenna 12c1 and the left probe antenna 12l are disposed at the position of X=0. Thus, when the phase difference between the position of X=0 and the position of X=2 at the time point tA is set as ΔPh(0, 2), and the phase difference between the position of X=0 and the position of X=3 at the time point tD is set as ΔPh(0, 3), the adjacent phase difference calculation unit 18 calculates the phase difference ΔPh(2, 3) between the position of X=2 and the position of X=3, by an expression of ΔPh(0, 3)−ΔPh(0, 2).

That is, in a case where the first probe antenna moves to one (X=0) of the plurality of measurement positions at the first time point (tA), and the second probe antenna moves to the same measurement position at the second time point (time point tD), the adjacent phase difference calculation unit 18 calculates a phase difference between radio signals at the measurement position (X=2) to which the third probe antenna has moved at the first time point and at the measurement position (X=3) to which the first probe antenna has moved at the second time point, in a manner that the phase difference between radio signals transmitted by the first probe antenna and the third probe antenna at the first time point is subtracted from the phase difference between radio signals received by the second probe antenna and the first probe antenna at the second time point.

Similar to the above descriptions for the positional relationship between the central probe antenna 12c1 and the left probe antenna 12l, the adjacent phase difference calculation unit 18 also calculates phase differences ΔPh(3, 4), ΔPh(4, 5), ΔPh(5, 6), . . . at time points subsequent to the time point tB.

As described above, a distance between the central probe antenna 12c1 and the left probe antenna 12l is longer than a distance between the central probe antenna 12c1 and the right probe antenna 12r by the distance d1 between two measurement positions adjacent to each other in the horizontal direction. Thus, the probe antennas are moved in the horizontal direction by the distance d1 while maintaining the relative positional relationship between the probe antennas, and thereby the phase difference can be measured at all the two measurement positions adjacent to each other in the horizontal direction.

That is, distances of the left probe antenna 12l and the right probe antenna 12r from the central probe antenna 12c1 are not limited to a case of 3d1 and 2d1 as in the example in FIG. 5, and may be, for example, 3d1 and 4d1.

Similarly, as shown in FIG. 3 and the like, a distance between the central probe antenna 12c2 and the upper probe antenna 12t is longer than a distance between the central probe antenna 12c2 and the lower probe antenna 12b by the distance d2 between two measurement positions adjacent to each other in the vertical direction. Thus, the probe antennas are moved in the vertical direction by the distance d2 while maintaining the relative positional relationship between the probe antennas, and thereby the phase difference can be measured at all the two measurement positions adjacent to each other in the vertical direction.

That is, in a case where the fourth probe antenna is moved to one of the plurality of measurement positions at the first time point, and the sixth probe antenna is moved to the same measurement position at the second time point, the adjacent phase difference calculation unit 18 calculates the phase difference between radio signals at the measurement position to which the fifth probe antenna has been moved to the first time point and at the measurement position to which the fourth probe antenna has been moved to the second time point, in a manner that the phase difference between the radio signals received by the fourth probe antenna and the sixth probe antenna at the second time point is subtracted from the phase difference between the radio signals received by the fifth probe antenna and the fourth probe antenna at the first time point.

In a case where the fourth probe antenna is moved to one of the plurality of measurement positions at the first time point, and the fifth probe antenna is moved to the same measurement position at the second time point, the adjacent phase difference calculation unit 18 calculates the phase difference between radio signals at the measurement position to which the sixth probe antenna has been moved at the first time point and at the measurement position to which the fourth probe antenna has been moved at the second time point, in a manner that the phase difference between the radio signals received by the fourth probe antenna and the sixth probe antenna at the first time point is subtracted from the phase difference between the radio signals received by the fifth probe antenna and the fourth probe antenna at the second time point.

That is, the phase calculation unit 18 can calculate the amplitude at each of the measurement positions and all phase differences between the adjacent measurement positions by causing the plurality of probe antennas 12 to two-dimensionally scan the measurement plane P. Any order of scanning by the probe scanning mechanism 13 is provided so long as the phase differences are able to be measured for all measurement positions.

In the example in FIG. 5, for example, the phase difference ΔPh(2, 3) is obtained from the positional relationship between the probe antennas at the time points tD and tF, and is obtained from the positional relationship between the probe antennas at the time points to and tD. For example, the phase difference averaging unit 25 outputs the phase difference obtained by averaging the two phase differences ΔPh(2, 3). As described above, in a case where a plurality of phase differences are measured for two measurement positions adjacent to each other in the horizontal direction at different time points, the phase difference averaging unit 25 averages the phase differences.

Figure 6:
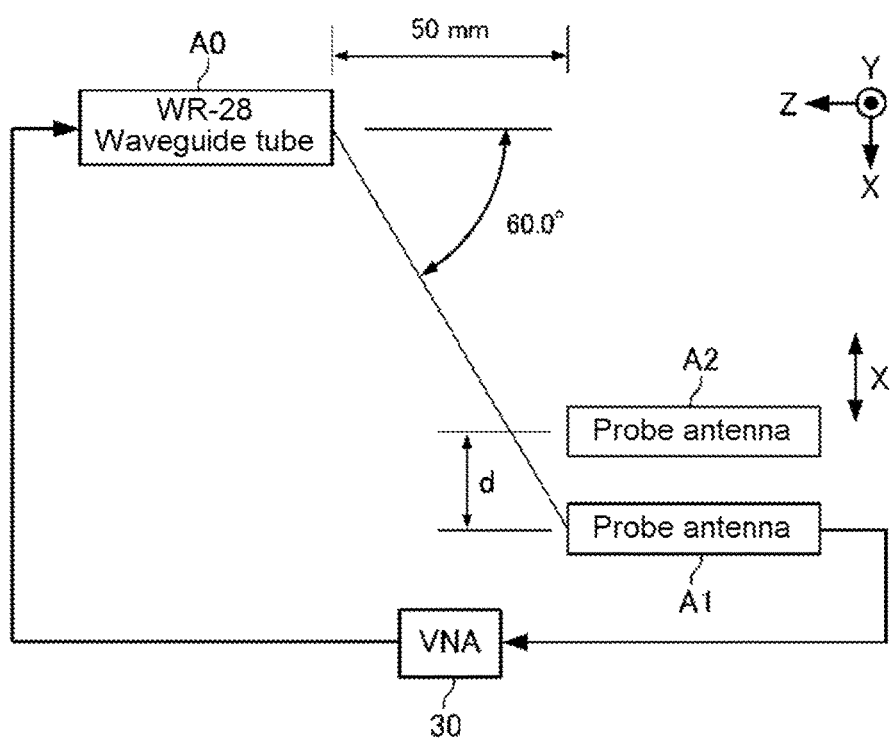
FIG. 6 is a schematic diagram illustrating a simulation model obtained by simulating two adjacent probe antennas and an antenna to be measured in the antenna measurement system according to the first embodiment of the present invention.

Similarly, in a case where the central probe antenna 12c2, the upper probe antenna 12t, and the lower probe antenna 12b are moved in the vertical direction of the measurement plane P, when the plurality of phase differences are measured for two measurement positions adjacent to each other in the vertical direction at different time points, the phase difference averaging unit 25 averages the phase differences With the simulation model illustrated in FIG. 6, a change of the phase of a radio signal received by one probe antenna in accordance with a distance between two probe antennas is checked. In the simulation model, a transmitting antenna corresponding to the antenna 100 to be measured is set to be a WR-28 waveguide tube A0 having a frequency band of 26.4 to 40.0 GHz. A receiving probe antenna A1 is fixed at a position having an angle of 60° to a normal line of an electromagnetic wave radiation plane of the WR-28 waveguide tube, in a state of being disposed such that the center thereof is located in a horizontal plane which is the same as that of the center of the WR-28 waveguide tube A0. In the simulation model, the WR-28 waveguide tube A0 and the probe antenna A1 are connected to a VNA 30.

Firstly, a reference phase is acquired only by the probe antenna A1 without installing a probe antenna A2. Then, the receiving probe antenna A2 is disposed such that the center thereof is located in the horizontal plane which is the same as that of the center of the WR-28 waveguide tube A0, and is disposed at a position spaced from the probe antenna A1 by a distance d in a direction of being close to the WR-28 waveguide tube A0 in the horizontal direction (X direction). The distance d is changed, and the phase is acquired from the probe antenna A1 in a similar manner.

Figure 7A:
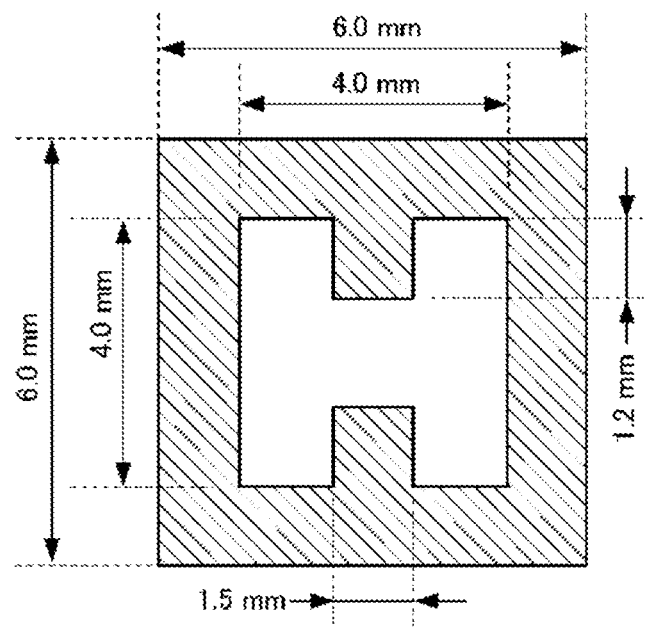
FIGS. 7A and 7B are cross-sectional views illustrating the configuration of the probe antenna in the simulation model in FIG. 6.

FIG. 8A illustrates simulation results at 28.0 GHz when the double-ridge waveguide tube illustrated in FIG. 7A is used as the probe antenna A1. In FIGS. 8A and 8B, the distance d normalized with the wavelength λ of a received signal is denoted. The phase of the radio signal received by the probe antenna A1 when the probe antenna A2 is not disposed in the horizontal plane is −117.1°. With the results in FIG. 8A, the followings are understood. That is, although there are variations, the phase difference from a case where the probe antenna A2 is not provided is large when the distance between the probe antennas A1 and A2 is small, and an absolute value of the phase difference is within 5°, from a range of about d≥3λ.

Figure 7B:
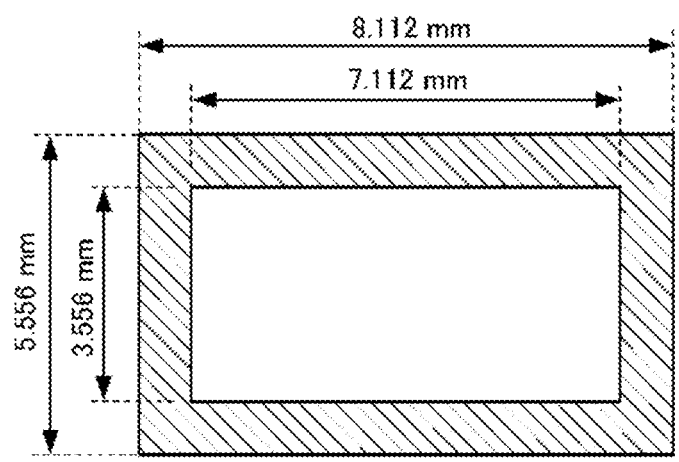

The probe antennas A1 and A2 are changed to WR-28 waveguide tubes illustrated in FIG. 7B, and then the similar simulation is performed. FIG. 8B illustrates simulation results at 28.0 GHz when the WR-28 waveguide tubes illustrated in FIG. 7B are used. The phase of the radio signal received by the probe antenna A1 when the probe antenna A2 is not disposed in the horizontal plane is −45.0°. Since the horizontal width of the WR-28 waveguide tube illustrated in FIG. 7B is 8.112 mm, and it is not possible that the probe antennas are arranged at a distance of 0.5λ in the horizontal direction, d=0.8λ is set to the minimum distance. With the results in FIG. 8A, it is understood that the absolute value of the phase difference at time of d≥2λ is within 5°.

With the above simulation results, it is understood that it is possible to suppress an influence between the probe antennas and to perform measurement similar to that when a single probe antenna performs measurement, by increasing the distance between the probe antennas.

Figure 9:
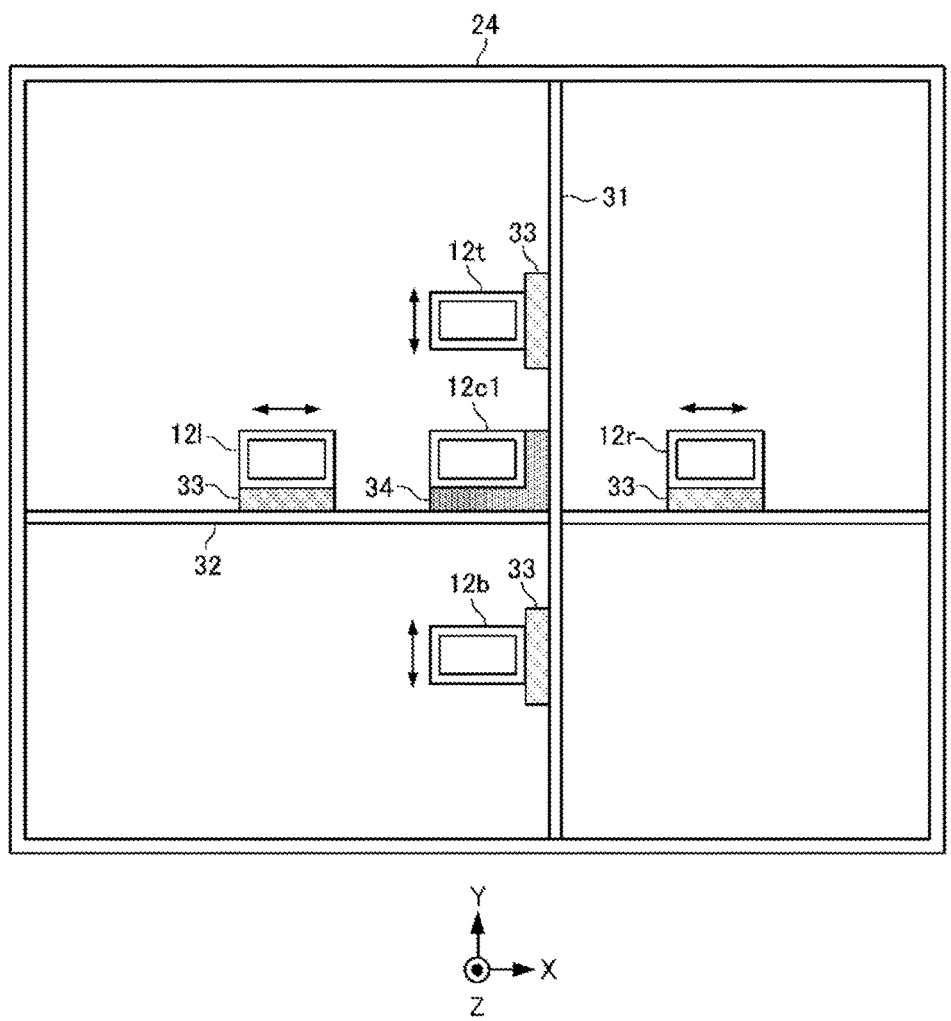
FIG. 9 is a schematic diagram illustrating a configuration example of an antenna holding unit included in the antenna measurement system according to the first embodiment of the present invention.

FIG. 9 illustrates a configuration example of the antenna holding unit 24 of the plurality of probe antennas 12 in the antenna measurement system 1. Since it is not necessary that the probe antennas 12 are arranged at a distance of 0.5λ, standard square waveguide tubes may be used as the probe antennas 12 instead of the double-ridge waveguide tubes.

The antenna holding unit 24 includes guides 31 and 32 extending up and down and left and right, a plurality of movable stages 33 movable to any position along the guides 31 and 32, and a fixing portion 34 that fixes the central probe antenna 12c1. The left probe antenna 121, the right probe antenna 12r, the upper probe antenna 12t, and the lower probe antenna 12b are attached to each of the movable stages 33. It is desirable that a radio wave absorber is appropriately disposed between the left probe antenna 12l, the right probe antenna 12r, the upper probe antenna 12t, and the lower probe antenna 12b.

The movable stage 33 may be manually moved in micrometer, or may be automatically moved by an actuator or the like attached to a motor. With the plurality of movable stages 33, the plurality of probe antennas 12 can be arranged at a proper distance which has been already described in FIG. 3 and the like, in accordance with the wavelength λ of a radio signal output from the antenna 100 to be measured.

Figure 10:
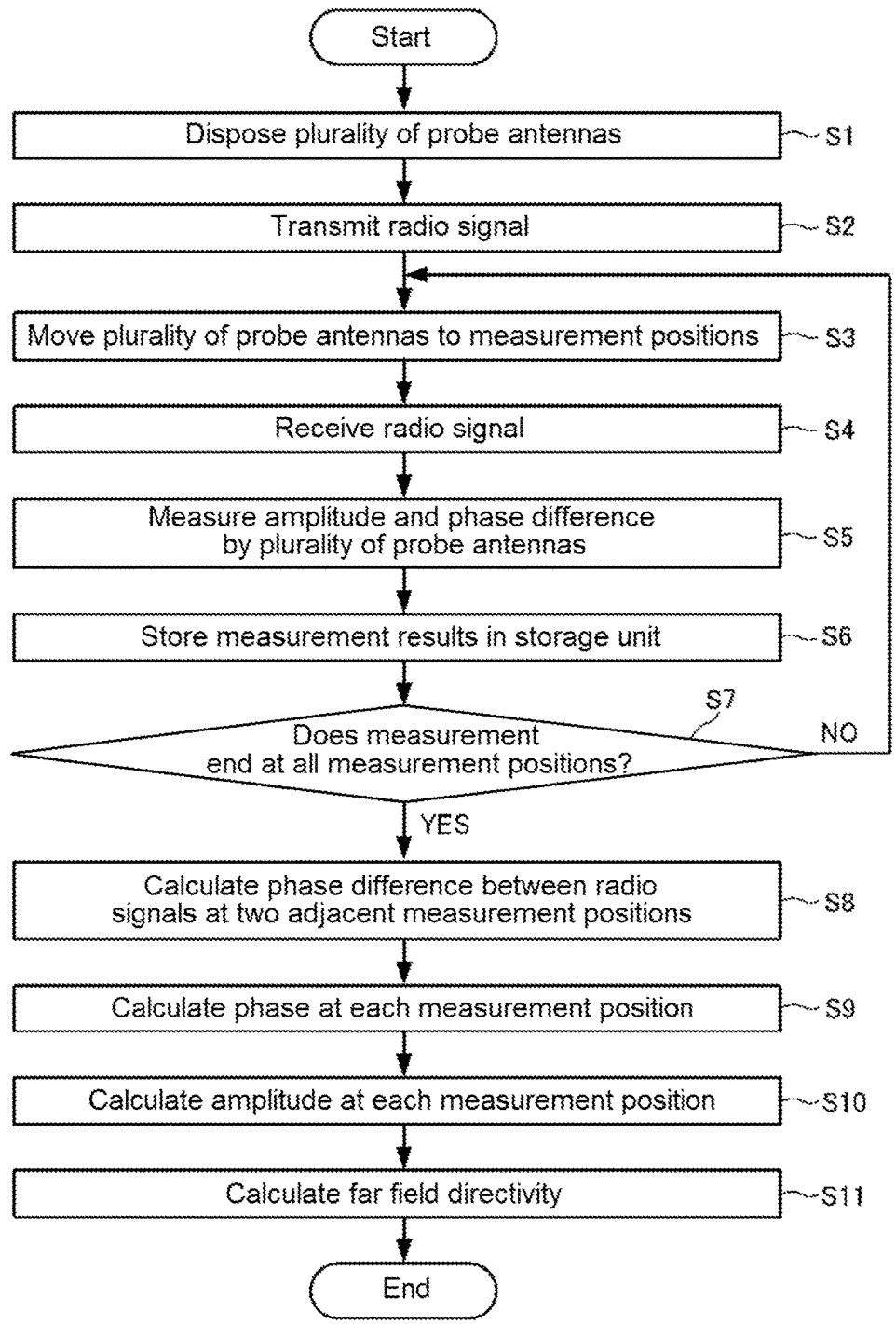
FIG. 10 is a flowchart illustrating a process of an antenna measurement method using the antenna measurement system according to the first embodiment of the present invention.

Hereinafter, an antenna measurement method which uses the antenna measurement system 1 according to the embodiment and uses the plurality of probe antennas 12 in order to measure the amplitude and the phase of a radio signal transmitted from the antenna 100 to be measured, in a near field, will be described with reference to the flowchart in FIG. 10.

Firstly, the control unit 23 arranges the plurality of probe antennas 12 at a distance depending on the wavelength λ of a radio signal to be output from the antenna 100 to be measured, in the antenna holding unit 24 (Step S1).

Then, the antenna 100 to be measured transmits a radio signal (Step S2).

Then, the scanning control unit 14 causes the probe scanning mechanism 13 to move the plurality of probe antennas 12 to measurement positions in the measurement plane P while maintaining relative positions thereof (probe scanning step S3).

The plurality of probe antennas 12 receives the radio signal output from the antenna 100 to be measured, at the measurement position to which the probe antennas have been moved in Step S3, in a near field region (Step S4).

Then, the amplitude and phase difference measurement unit 16 measures a phase difference between radio signals received by two probe antennas which are adjacent to each other in the horizontal direction or the vertical direction among the plurality of probe antennas 12. The amplitude and phase difference measurement unit 16 measures the amplitudes of the radio signals received by the plurality of probe antennas 12 (amplitude and phase difference measuring step S5).

Then, the storage unit 17 stores the phase difference and the amplitudes measured in Step S5, in association with the corresponding measurement position at which the measurement has been performed (Step S6).

The control unit 23 determines whether or not values of phase differences and amplitudes are obtained at all measurement positions in the measurement plane P (Step S7). In a case of negative determination, the process returns to step S3. In a case of positive determination, the process proceeds to Step S8.

In Step S8, the adjacent phase difference calculation unit 18 calculates a phase difference between radio signals at two adjacent measurement positions, from the phase difference measured by Step S5 (adjacent phase difference calculation step S8).

Then, the phase calculation unit 19 calculates the phase of the radio signal at each of the measurement positions, from the phase difference calculated by Step S8 (phase calculation step S9). Further, the phase calculation unit 19 outputs the calculated phase at each of the measurement positions, to the far field directivity calculation unit 21 in a form of phase information.

In a case where the antenna measurement system 1 includes the phase difference averaging unit 25, in Step S9, the phase calculation unit 19 causes the phase difference averaging unit 25 to average a plurality of phase differences which have been calculated at the two adjacent measurement positions by Step S8. The phase calculation unit 19 calculates the phase of a radio signal at each of the measurement positions from the averaged phase difference, and outputs the calculated phase to the far field directivity calculation unit 21 in a form of phase information. In Step S9, an averaging process by the phase difference averaging unit 25 may be omitted.

Then, in a case where the antenna measurement system 1 includes the amplitude averaging unit 20, the amplitude averaging unit 20 outputs the value obtained by averaging the plurality of amplitudes measured at measurement positions in Step S5, to the far field directivity calculation unit 21 in a form of amplitude information (Step S10). In a case where the antenna measurement system 1 does not include the amplitude averaging unit 20, the amplitude and phase difference measurement unit 16 outputs the amplitude measured in Step S5 to the far field directivity calculation unit 21 in a form of amplitude information.

Then, the far field directivity calculation unit 21 calculates far field directivity by using the position information, the phase information, and the amplitude information which have been obtained for all measurement positions (far field directivity calculation step S11).

As described above, the antenna measurement system 1 according to the embodiment can measure phases and amplitudes of a radio signal transmitted from the antenna 100 to be measured which is formed integrally with an RF circuit, in a near field, without supplying a reference signal from the antenna 100 to be measured.

In the antenna measurement system 1 according to the embodiment, the distance between the adjacent probe antennas 12 can be set to be equal to or less than 0.5λ. Thus, it is possible to suppress an influence between the probe antennas, and thus to measure a phase difference between adjacent measurement positions in a measurement plane of a near field region of the antenna 100 to be measured, with high accuracy.

In the antenna measurement system 1 according to the embodiment, it is possible to adjust the distance between the probe antennas 12 in accordance with the wavelength λ of a radio signal. Thus, it is possible to perform measurement in a wide range.

In the antenna measurement system 1 according to the embodiment, the distance between the adjacent probe antennas 12 can be set to be equal to or less than 0.5λ. Thus, it is possible to use a standard square waveguide tube as the probe antenna 12. Thus, it is possible to realize a wide use band and a high receiving sensitivity, and it is easy to manufacture the antenna measurement system 1.

In the antenna measurement system 1 according to the embodiment, it is also possible to set the distance between the adjacent measurement positions, that is, the sampling interval to be less than 0.5λ.

In the antenna measurement system 1 according to the embodiment, in a case where the number of probe antennas 12 decreases from 6 to 5, it is possible to further suppress the influence between the probe antennas and to reduce the measurement time by narrowing the scanning range of the scanning control unit 14.

In addition, in the antenna measurement system 1 according to the embodiment, the radio signal transmitted from the antenna 100 to be measured which is formed integrally with an RF circuit is measured using a near field measurement, and thus it is possible to calculate the electric field intensity distribution in a far field.

In the antenna measurement system 1 according to the embodiment, since the plurality of phase differences calculated for the two adjacent measurement positions are averaged by the adjacent phase difference calculation unit 18, it is possible to obtain the phase distribution with higher accuracy.

In the antenna measurement system 1 according to the embodiment, in a case where the aperture shapes of the plurality of probe antennas 12 are the same as each other, the receiving sensitivity of the respective probe antenna 12 become equal to each other, and amplitude averaging is easily performed.

In addition, it is possible to use a non-modulated wave signal, a broadband signal (for example, OFDM signal), or the like, as the radio signal transmitted from the antenna 100 to be measured, during the measurement of the directivity, which is performed by the antenna measurement system 1 according to the embodiment. In this case, if a spectrum analyzer is used in the amplitude and phase difference measurement unit 16, it is possible to measure the phase and amplitude of a wide-band radio signal in a short period of time, and to calculate the electric field intensity distribution in a wide band at a fast rate.

Second Embodiment

Subsequently, an antenna measurement system 2 according to a second embodiment of the present invention will be described with reference to the accompanying drawings. The same components as those of the antenna measurement system 1 according to the first embodiment are denoted by the same reference numerals and signs, and thus the detailed description thereof will not be given.

Figure 11:
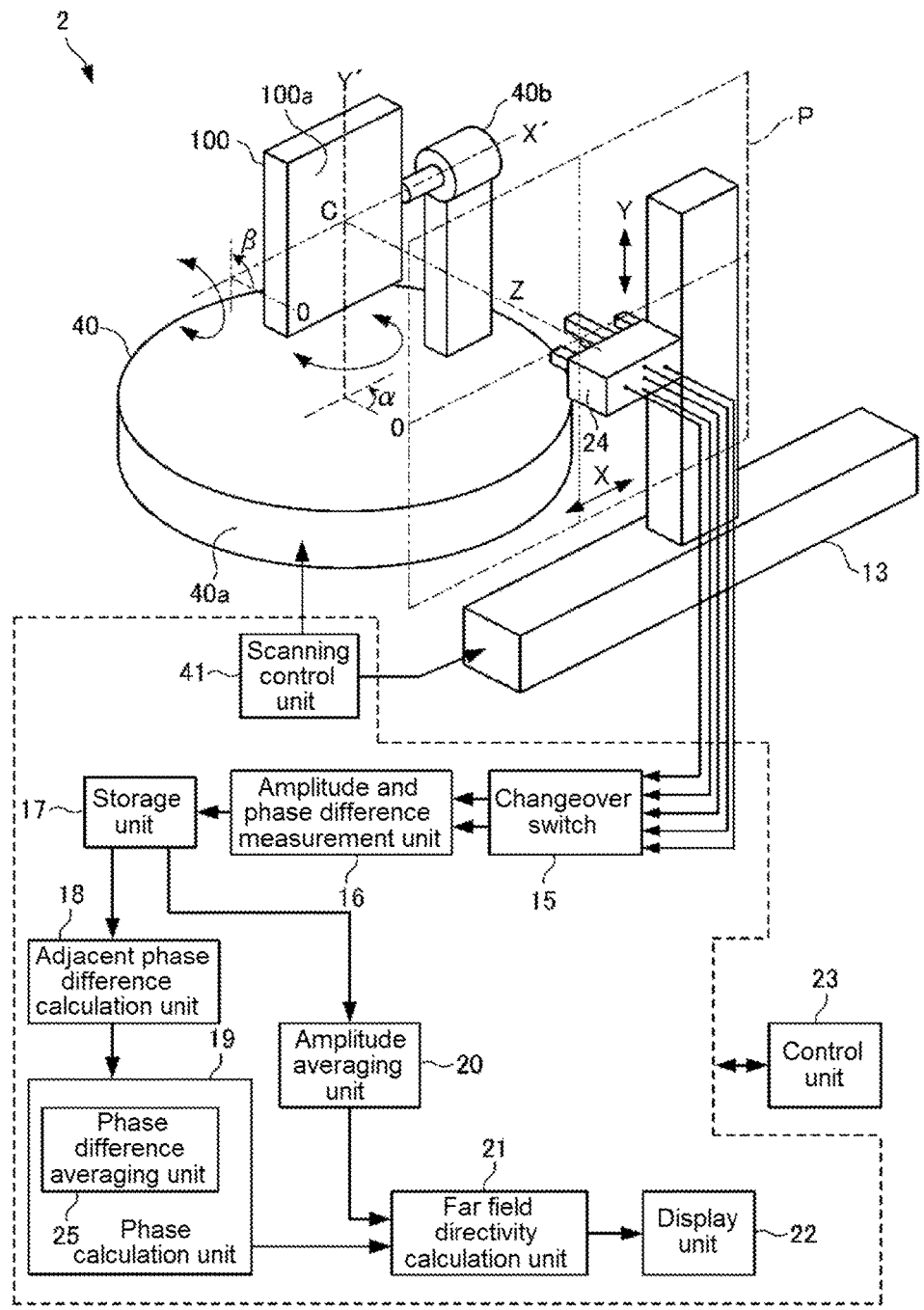
FIG. 11 is a diagram illustrating a configuration of an antenna measurement system according to a second embodiment of the present invention.
Figure 12:
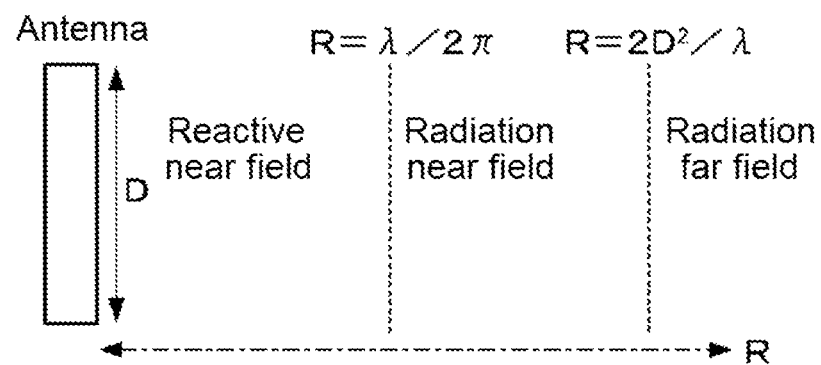
FIG. 12 is a diagram illustrating a measurement region of an antenna.
Figure 13:
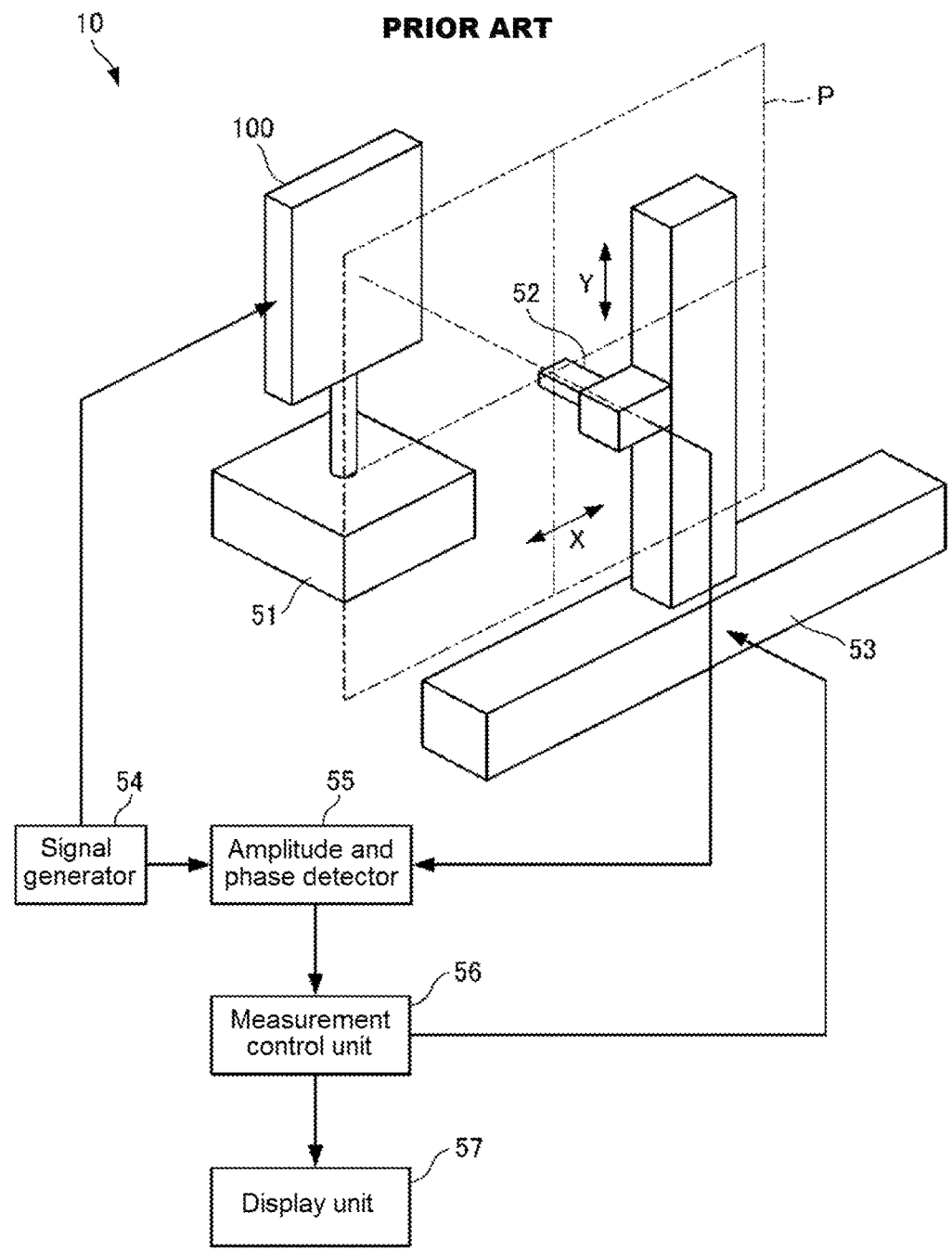
FIG. 13 is a diagram illustrating a configuration of an antenna measurement system in the related art.

The antenna measurement system 2 of the present embodiment includes an antenna support 40 and a scanning control unit 41 which are components shown in FIG. 11, instead of the antenna support 11 and the scanning control unit 14 in the first embodiment.

The antenna support 40 supports the antenna 100 to be measured so that a direction in which an electromagnetic wave radiation plane 100a (aperture plane of an antenna) thereof directly faces a measurement plane P is set to a reference direction, and that the electromagnetic wave radiation plane 100a can change to a state of being inclined from the measurement plane P from the reference direction. Here, the reference direction refers to a state where the electromagnetic wave radiation plane 100a of the antenna 100 to be measured faces the measurement plane P in parallel, and a Z-axis which is orthogonal to an X-axis and a Y-axis at the origin position of the measurement plane P passes through a central position C of the electromagnetic wave radiation plane 100a.

For example, as illustrated in FIG. 11, the antenna support 40 includes an azimuth change mechanism portion 40a that rotates around a Y'-axis passing through the central position C of the electromagnetic wave radiation plane 100a of the antenna 100 to be measured in parallel to the Y-axis of the measurement plane P, and an elevation angle change mechanism portion 40b, fixed onto the azimuth change mechanism portion 40a, which supports the antenna 100 to be measured on the rotational axis of the azimuth change mechanism portion 40a and rotates the antenna 100 to be measured around an X'-axis passing through the central position C of the electromagnetic wave radiation plane 100a of the antenna 100 to be measured in parallel to the X-axis of the measurement plane P.

The azimuth angle of 0° (reference angle) of the antenna 100 to be measured based on the azimuth change mechanism portion 40a is a direction parallel to the Z-axis, and the azimuth angle can be changed to any angle $\alpha$ around the Y'-axis on the basis of this direction. Similarly, the elevation angle of 0° (reference angle) of the antenna 100 to be measured based on the elevation angle change mechanism portion 40b is also a direction parallel to the Z-axis, and the elevation angle can be changed to any angle $\beta$ around the X'-axis on the basis of this direction.

As is the case with the first embodiment, the scanning control unit 41 is configured to control the probe scanning mechanism 13, and to control the azimuth change mechanism portion 40a and the elevation angle change mechanism portion 40b of the antenna support 40.

As described above, in the antenna measurement system 2 according to the present embodiment, even in a case where a beam direction when the antenna 100 to be measured is directed toward the reference direction is away from the center of the measurement plane P, it is possible to obtain a directivity in the measurement plane P having a minimum size by rotating the antenna 100 to be measured.

DESCRIPTION OF REFERENCE NUMERALS AND SIGNS 1, 2 antenna measurement system
11, 40 antenna support
12, 12c1, 12c2, 121, 12r, 12t, 12b probe antenna
13 probe scanning mechanism
14, 41 scanning control unit
15 changeover switch
16 amplitude and phase difference measurement unit
17 storage unit
18 adjacent phase difference calculation unit
19 phase calculation unit
20 amplitude averaging unit
21 far field directivity calculation unit
22 display unit
23 control unit
24 antenna holding unit
25 phase difference averaging unit
27 waveguides
31 and 32 guide 33 movable stage
34 fixing portion
40a azimuth change mechanism portion
40b elevation angle change mechanism portion
100 antenna to be measured
100a electromagnetic wave radiation plane

What is claimed is:
1. An antenna measurement system that measures an amplitude and a phase of a radio signal transmitted from an antenna to be measured, in a near field, the system comprising:
  a plurality of probe antennas that receive radio signals at a plurality of measurement positions set in a predetermined measurement plane of a near field region of the antenna to be measured;
  a probe scanning mechanism that moves each of the probe antennas to the plurality of measurement positions;
  an amplitude and phase difference measurement unit that measures a phase difference between radio signals received by the plurality of probe antennas and measures an amplitude of each of the radio signals received by the plurality of probe antennas, every time each of the probe antennas is moved to the measurement position by the probe scanning mechanism;

an adjacent phase difference calculation unit that calculates a phase difference between the radio signals at two measurement positions adjacent to each other, from the phase difference measured by the amplitude and phase difference measurement unit; and a phase calculation unit that calculates a phase of the radio signal at each of the measurement positions, from the phase difference calculated by the adjacent phase difference calculation unit, wherein the plurality of probe antennas include a first probe antenna, and a second probe antenna and a third probe antenna disposed to interpose the first probe antenna therebetween, and a difference between a distance between a center of the first probe antenna and a center of the second probe antenna in the measurement plane, and a distance between the center of the first probe antenna and a center of the third probe antenna in the measurement plane is a distance between the two measurement positions adjacent to each other.

2. The antenna measurement system according to claim 1, wherein the antenna to be measured is integrally formed with an RF function, the probe scanning mechanism moves each of the probe antennas to the plurality of measurement positions while maintaining relative positions of the plurality of probe antennas, the first probe antenna, the second probe antenna, and the third probe antenna are disposed in the measurement plane in a horizontal direction, the plurality of probe antennas further include a fourth probe antenna, and a fifth probe antenna and a sixth probe antenna disposed to interpose the fourth probe antenna therebetween in the measurement plane in a vertical direction, and a difference between a distance between a center of the fourth probe antenna and a center of the fifth probe antenna in the measurement plane, and a distance between the center of the fourth probe antenna and a center of the sixth probe antenna in the measurement plane is a distance between two measurement positions which are adjacent to each other in the vertical direction.

3. The antenna measurement system according to claim 2, wherein any one of the first probe antenna, the second probe antenna, and the third probe antenna is also used as any one of the fourth probe antenna, the fifth probe antenna, and the sixth probe antenna.

4. The antenna measurement system according to claim 1, wherein, in a case where the first probe antenna is moved to one of the plurality of measurement positions at a first time point, and the third probe antenna is moved to the same measurement position at a second time point, the adjacent phase difference calculation unit calculates the phase difference between radio signals at the measurement position to which the second probe antenna has been moved at the first time point, and at the measurement position to which the first probe antenna has been moved at the second time point, in a manner that the phase difference between the radio signals received by the first probe antenna and the third probe antenna at the second time point is subtracted from the phase difference of the radio signals received by the second probe antenna and the first probe antenna at the first time point.

5. The antenna measurement system according to claim 1, wherein, in a case where the first probe antenna is moved to one of the plurality of measurement positions at a first time point, and the second probe antenna is moved to the same measurement position at a second time point, the adjacent phase difference calculation unit calculates the phase difference between radio signals at the measurement position to which the third probe antenna has been moved at the first time point and at the measurement position to which the first probe antenna has been moved at the second time point, in a manner that the phase difference between the radio signals received by the first probe antenna and the third probe antenna at the first time point is subtracted from the phase difference between the radio signals received by the second probe antenna and the first probe antenna at the second time point.

6. The antenna measurement system according to claim 2, wherein, in a case where the fourth probe antenna is moved to one of the plurality of measurement positions at a first time point, and the sixth probe antenna is moved to the same measurement position at a second time point, the adjacent phase difference calculation unit calculates the phase difference between radio signals at the measurement position to which the fifth probe antenna has been moved at the first time point and at the measurement position to which the fourth probe antenna has been moved at the second time point, in a manner that the phase difference between the radio signals received by the fourth probe antenna and the sixth probe antenna at the second time point is subtracted from the phase difference between the radio signals received by the fifth probe antenna and the fourth probe antenna at the first time point.

7. The antenna measurement system according to claim 2, wherein, in a case where the fourth probe antenna is moved to one of the plurality of measurement positions at a first time point, and the fifth probe antenna is moved to the same measurement position at a second time point, the adjacent phase difference calculation unit calculates the phase difference between radio signals at the measurement position to which the sixth probe antenna has been moved at the first time point and at the measurement position to which the fourth probe antenna has been moved at the second time point, in a manner that the phase difference between the radio signals received by the fourth probe antenna and the sixth probe antenna at the first time point is subtracted from the phase difference between the radio signals received by the fifth probe antenna and the fourth probe antenna at the second time point.

8. The antenna measurement system according to claim 1, further comprising:

a far field directivity calculation unit that calculates far field directivity by using information of the amplitude measured by the amplitude and phase difference measurement unit and information of the phase calculated by the phase calculation unit.

9. The antenna measurement system according to claim 1, wherein the phase calculation unit includes a phase difference averaging unit that averages a plurality of phase differences calculated by the adjacent phase difference calculation unit at two measurement positions adjacent to each other, and calculates the phase of the radio signal at each of the measurement position from the phase difference averaged by the phase difference averaging unit.

10. The antenna measurement system according to claim 1,
wherein aperture shapes of the plurality of probe antennas are the same as each other.

11. The antenna measurement system according to claim 1, further comprising:
an antenna support that supports the antenna to be measured,
wherein the antenna support is configured such that a direction in which an electromagnetic wave radiation plane of the antenna to be measured directly faces the measurement plane is set as a reference direction, and a direction of the electromagnetic wave radiation plane is allowed to be changed from the reference direction.

12. The antenna measurement system according to claim 1,
wherein the plurality of probe antennas are square waveguide tubes, and
a distance between a center of the first probe antenna and a center of the third probe antenna is equal to or more than two times a wavelength of the radio signal.

13. The antenna measurement system according to claim 1,
wherein the plurality of probe antennas are double-ridge waveguide tubes, and
a distance between a center of the first probe antenna and a center of the third probe antenna is equal to or more than three times a wavelength of the radio signal.

14. The antenna measurement system according to claim 1, further comprising:
a movable stage attached to each of the plurality of probe antennas.

15. The antenna measurement system according to claim 2, further comprising:
a movable stage attached to each of the plurality of probe antennas.

16. The antenna measurement system according to claim 2,
wherein, in a case where the first probe antenna is moved to one of the plurality of measurement positions at a first time point, and the third probe antenna is moved to the same measurement position at a second time point,
the adjacent phase difference calculation unit calculates phase differences of radio signals at the measurement position to which the second probe antenna has been moved at the first time point, and at the measurement position to which the first probe antenna has been moved at the second time point, in a manner that the phase difference between the radio signals received by the first probe antenna and the third probe antenna at the second time point is subtracted from the phase difference of the radio signals received by the second probe antenna and the first probe antenna at the first time point.

17. The antenna measurement system according to claim 2,
wherein, in a case where the first probe antenna is moved to one of the plurality of measurement positions at a first time point, and the second probe antenna is moved to the same measurement position at a second time point,
the adjacent phase difference calculation unit calculates phase differences between radio signals at the measurement position to which the third probe antenna has been moved at the first time point and at the measurement position to which the first probe antenna has been moved at the second time point, in a manner that the phase difference between the radio signals received by the first probe antenna and the third probe antenna at the first time point is subtracted from the phase difference between the radio signals received by the second probe antenna and the first probe antenna at the second time point.

18. The antenna measurement system according to claim 3,
wherein, in a case where the fourth probe antenna is moved to one of the plurality of measurement positions at a first time point, and the sixth probe antenna is moved to the same measurement position at a second time point,
the adjacent phase difference calculation unit calculates phase differences between radio signals at the measurement position to which the fifth probe antenna has been moved at the first time point and at the measurement position to which the fourth probe antenna has been moved at the second time point, in a manner that the phase difference between the radio signals received by the fourth probe antenna and the sixth probe antenna at the second time point is subtracted from the phase difference between the radio signals received by the fifth probe antenna and the fourth probe antenna at the first time point.

19. The antenna measurement system according to claim 3,
wherein, in a case where the fourth probe antenna is moved to one of the plurality of measurement positions at a first time point, and the fifth probe antenna is moved to the same measurement position at a second time point,
the adjacent phase difference calculation unit calculates phase differences between radio signals at the measurement position to which the sixth probe antenna has been moved at the first time point and at the measurement position to which the fourth probe antenna has been moved at the second time point, in a manner that the phase difference between the radio signals received by the fourth probe antenna and the sixth probe antenna at the first time point is subtracted from the phase difference between the radio signals received by the fifth probe antenna and the fourth probe antenna at the second time point.

20. An antenna measurement method using a plurality of probe antennas that receive radio signals at a plurality of measurement positions set in a predetermined measurement plane of a near field region of an antenna to be measured in order to measure an amplitude and a phase of the radio signal transmitted from the antenna to be measured, in a near field, the method comprising:
a probe scanning step of moving each of the probe antennas to the plurality of measurement positions;
an amplitude and phase difference measuring step of measuring a phase difference between radio signals received by the plurality of probe antennas and measuring an amplitude of each of the radio signals received by the plurality of probe antennas, every time each of the probe antennas is moved to the measurement position in the probe scanning step;
an adjacent phase difference calculation step of calculating a phase difference between the radio signals at two measurement positions adjacent to each other from the phase difference measured by the amplitude and phase difference measuring step; and a phase calculation step of calculating the phase of the radio signal at each of the measurement positions from the phase difference calculated by the adjacent phase difference calculation step, wherein the plurality of probe antennas include a first probe antenna, and a second probe antenna and a third probe antenna disposed to interpose the first probe antenna therebetween in the measurement plane, and a distance between a center of the first probe antenna and a center of the second probe antenna in the measurement plane is longer than a distance between the center of the first probe antenna and a center of the third probe antenna in the measurement plane by a distance between two measurement positions which are adjacent to each other.

* * * * *